United States Patent
Chew et al.

(10) Patent No.: US 6,518,622 B1
(45) Date of Patent: Feb. 11, 2003

(54) VERTICAL REPLACEMENT GATE (VRG) MOSFET WITH A CONDUCTIVE LAYER ADJACENT A SOURCE/DRAIN REGION AND METHOD OF MANUFACTURE THEREFOR

(75) Inventors: Hongzong Chew, Orlando, FL (US); Yih-Feng Chyan, Orlando, FL (US); John M. Hergenrother, Shorthills, NJ (US); Yi Ma, Orlando, FL (US); Donald P. Monroe, Summit, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/528,753

(22) Filed: Mar. 20, 2000

(51) Int. Cl.$^7$ ............................................. H01L 29/76
(52) U.S. Cl. ...................... 257/329; 257/328; 257/302; 257/135
(58) Field of Search ................................ 257/329, 135, 257/328, 302; 438/212

(56) References Cited

U.S. PATENT DOCUMENTS

| | | | | |
|---|---|---|---|---|
| 5,122,848 A | * | 6/1992 | Lee et al. ................... | 357/23.6 |
| 5,136,350 A | * | 8/1992 | Itoh .......................... | 357/23.4 |
| 5,414,288 A | * | 5/1995 | Fitch et al. ................ | 257/328 |
| 5,414,289 A | * | 5/1995 | Fitch et al. ................ | 257/329 |
| 5,483,094 A | * | 1/1996 | Sharma et al. ............. | 257/316 |
| 5,504,359 A | * | 4/1996 | Rodder ...................... | 257/329 |
| 5,599,724 A | * | 2/1997 | Yoshida ..................... | 437/40 |
| 5,707,885 A | * | 1/1998 | Lim .......................... | 437/52 |
| 5,872,374 A | * | 2/1999 | Tang et al. ................. | 257/328 |
| 5,994,779 A | * | 11/1999 | Gardner et al. ............ | 257/773 |
| 6,027,975 A | * | 2/2000 | Hergenrother et al. ..... | 438/268 |
| 6,049,106 A | * | 4/2000 | Forbes ....................... | 257/329 |
| 6,060,746 A | * | 5/2000 | Bertin et al. .............. | 257/331 |
| 6,104,077 A | * | 8/2000 | Gardner et al. ............ | 257/522 |
| 6,107,133 A | * | 8/2000 | Furukawa et al. .......... | 438/239 |
| 6,127,209 A | * | 10/2000 | Maeda et al. .............. | 438/151 |
| 6,165,823 A | * | 12/2000 | Kim et al. .................. | 438/156 |

FOREIGN PATENT DOCUMENTS

| | | | |
|---|---|---|---|
| JP | 05218439 | * | 8/1993 |
| WO | WO 98/42026 | | 9/1998 |

* cited by examiner

*Primary Examiner*—Eddie Lee
*Assistant Examiner*—Eugene Lee

(57) ABSTRACT

The present invention provides a VRG structure formed on a semiconductor wafer substrate. The VRG structure has a first source/drain region located in a semiconductor wafer substrate, and a conductive layer located adjacent the source/drain region, a second source/drain region and a conductive channel that extends from the first source/drain region to the second source/drain region. The conductive layer provides an electrical connection to the first source/drain region. The conductive layer may have a low sheet resistance that may be less than about 50 Ω/square or less than about 20 Ω/square, to the first source/drain region.

24 Claims, 5 Drawing Sheets

VERTICAL REPLACEMENT GATE (VRG) MOSFET WITH A CONDUCTIVE LAYER ADJACENT A SOURCE/DRAIN REGION AND METHOD OF MANUFACTURE THEREFOR

TECHNICAL FIELD OF THE INVENTION

The present invention is directed, in general, to a semiconductor device and a method of manufacture therefor and, more specifically, to a vertical replacement gate (VRG) metal oxide semiconductor field effect transistor (MOSFET) with a conductive layer adjacent a source/drain region and a method of manufacture therefor.

BACKGROUND OF THE INVENTION

Enhancing semiconductor device performance continues to be a focus of the semiconductor industry. As a result, both smaller device size and increased performance have been identified as desirable manufacturing targets. As device dimensions within semiconductor devices, such as gates within integrated circuits (ICs), continue to shrink, the method for forming such gates has adapted to effectively accomplish the shrinking devices. However, manufacturing limitations have particularly arisen with respect to the lithographic processes currently used to manufacture such shrunken devices. In fact, current lithographic processes have been unable to accurately manufacture devices at the required minimal sizes. Moreover, this is a limitation that the semiconductor industry, to date, has been unable to correct.

In view of the current limitations in the semiconductor manufacturing lithography process, and the desire to manufacture smaller devices, the semiconductor industry developed a VRG transistor structure. The VRG transistor structure circumvents the limitations associated with the lithographic process discussed above, by keeping each individual device component within functional lithographic limitation and building the devices vertical rather than horizontal on the semiconductor wafer. This allows overall device performance of the semiconductor wafer to be increased without encountering the lithographic limitations discussed above. Unfortunately, however, these VRG structures often have high sheet resistance associated with their structures. Currently, a high dose implant (1E15) is used to form the drain of the VRG structure. Typically, the implant produces a sheet resistance of about 50 Ω/square. However, this relatively high drain sheet resistance significantly slows down the device static and high-frequency performance, due to the large conducting distance from the drain extension to the drain metal contact, in the VRG structure. The slow down of the device produces an undesirable slow down in the device speeds. The semiconductor manufacturing industry attempted to increase the high dose implant to an amount greater than 1E15; however, the industry encountered activation problems within the drain, which resulted from the extremely high dose implant.

Accordingly, what is needed in the art is a vertical replacement gate (VRG) metal oxide semiconductor field effect transistor (MOSFET) that can be used to maintain shrunken device size and increased packing density, while avoiding the slow device speeds as encountered in the prior art. The present invention addresses this need.

SUMMARY OF THE INVENTION

To address the above-discussed deficiencies of the prior art, the present invention provides a VRG structure formed on a semiconductor wafer substrate. The VRG structure has a first source/drain region located in a semiconductor wafer substrate, and a conductive layer located adjacent the first source/drain region, a second source/drain region and a conductive channel that extends from the first source/drain region to the second source/drain region. The conductive layer provides an electrical connection to it the source/drain region. In a preferred embodiment, the conductive layer has a low sheet resistance that may be less than about 50 Ω/square, and preferably less than about 20 Ω/square, to the first source/drain region. In another embodiment, the VRG structure further comprises a gate located over the conductive layer with the second source/drain region being located adjacent the gate and the conductive layer. In another one embodiment, the conductive channel has a first source/drain region extension and a second source/drain region extension.

Thus, in one aspect, the present invention provides a VRG structure with a conductive layer that is electrically connected to the source/drain region and provides electrical connection to the source/drain region that allows the VRG structure to operate in a more rapid and efficient manner.

The foregoing has outlined, rather broadly, preferred and alternative features of the present invention so that those skilled in the art may better understand the detailed description of the invention that follows. Additional features of the invention are described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
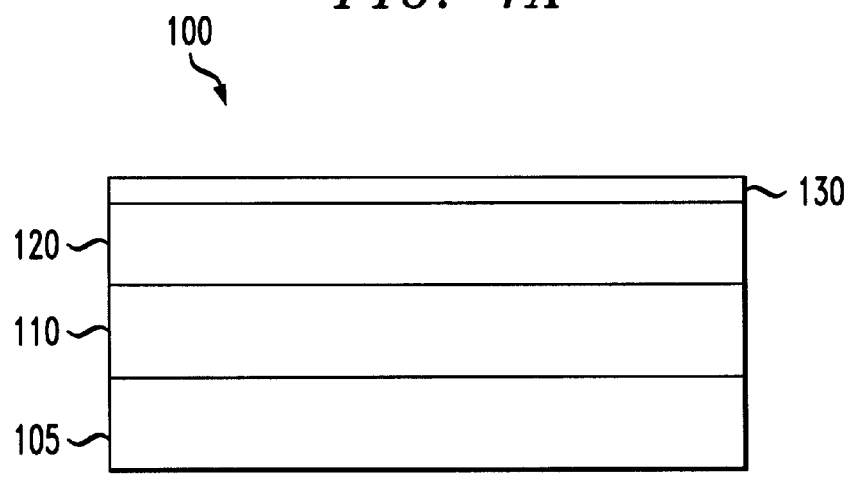
FIG. 1A illustrates a partial sectional view of a VRG structure covered by the present invention during an initial phase of manufacture.

Turning initially to FIG. 1A, there is illustrated a VRG structure 100 of the present invention, during an initial phase of manufacture. In this particular illustration, a first or bottom source/drain region 110 is conventionally formed in a semiconductor substrate 105. A semiconductor substrate for purposes of the present application may not only include a substrate of the a semiconductor wafer itself, but can also include a substrate of any material deposited on the semiconductor wafer. In the illustrated embodiment, the first source/drain region 110 comprises silicon that has been implanted with a high dose dopant, such as an n-type dopant. However, one having skill in the art knows, obviously, that the first source/drain region 110 may comprise other substances of which may be implanted with different amounts of varying implants.

A conductive layer 120 is conventionally formed adjacent the first source/drain region 110, and more preferably on the first source/drain region 110. In the illustrated embodiment, the conductive layer 120 is formed on the first source/drain region. Preferably, the conductive material includes a metal, and is, more preferably, a metal silicide, such as tungsten silicide (WSi). In an alternative embodiment, however, the conductive layer 120 may comprise cobalt silicide ($CoSi_2$), titanium silicide ($TSi_2$) or titanium nitride (TiN). One having skill in the art knows that any other low sheet resistance conductive material (i.e., one having a resistance less than about 50 Ω/square and preferably less than about 20 Ω/square), suitable for the invention, may be used for the conductive layer 120.

Conventionally deposited over the conductive layer 120 is a first dielectric layer 130. The first dielectric layer 130 is preferably a nitride; however, one having skill in the art knows that other known dielectric materials may comprise the first dielectric layer 130. Conventional deposition techniques, including physical vapor deposition (PVD) and chemical vapor deposition (CVD), may be used to form the substrate 105, first source/drain region 110, conductive layer 120, and first dielectric layer 130.

Figure 1B:
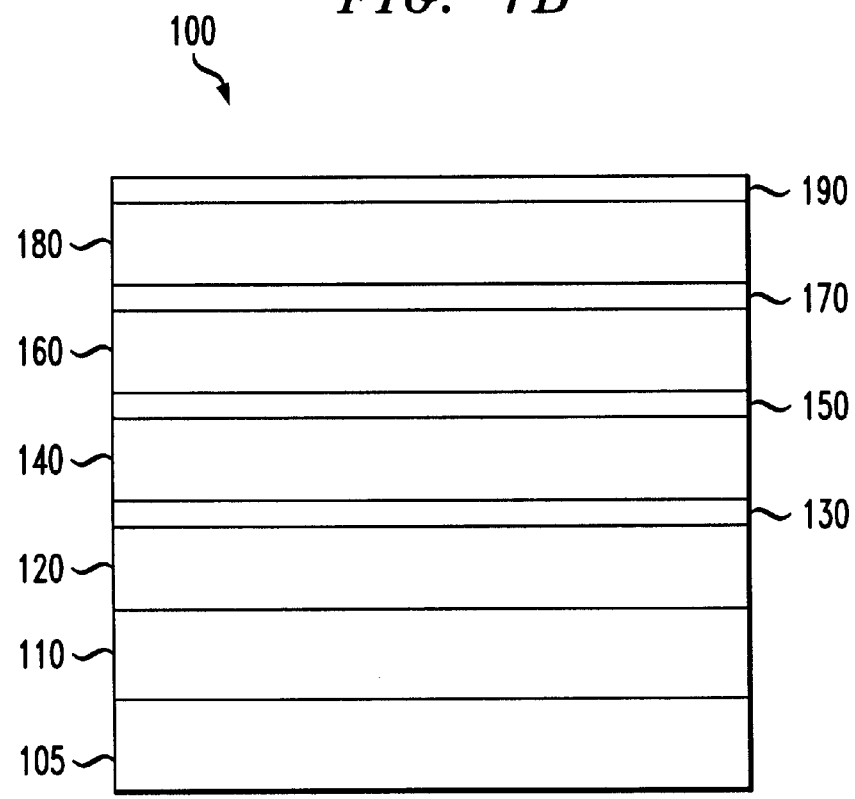
FIG. 1B illustrates a partial sectional view of the VRG structure illustrated in FIG. 1A having additional insulating layers formed thereon.

Turning now to FIG. 1B, illustrated is the partially constructed VRG structure 100 illustrated in FIG. 1A, having additional layers formed thereon. Over the first dielectric layer 130 is conventionally deposited a first insulating layer 140, which is then followed by a conventional deposition of a second dielectric layer 150. In the illustrated embodiment, the first insulating layer 140 comprises phosphosilicate glass (PSG), but other similar insulating materials may be used. Following the conventional deposition of the second dielectric layer 150, is the deposition of another dielectric layer 160, such as a tetra-ethyl-ortho-silicate (TEOS) layer, a third dielectric layer 170, a second insulating layer 180 and a fourth dielectric layer 190. As discussed earlier, all of the layers 130, 140, 150, 160, 170, 180, 190 may be deposited using conventional PVD and CVD processes, or any other deposition processes known to those who are skilled in the art. In the illustrated embodiment, the dielectric layers 130, 150, 170, 190 are preferably nitride layers. However, other dielectric materials may be used as well. The sequence of the various insulating or dielectric layers discussed above are with respect to a preferred embodiment. It should be understood however, that other embodiments may include different layered or non-layered structures sufficient to form a conductive channel for the VRG as discussed below.

Figure 2:
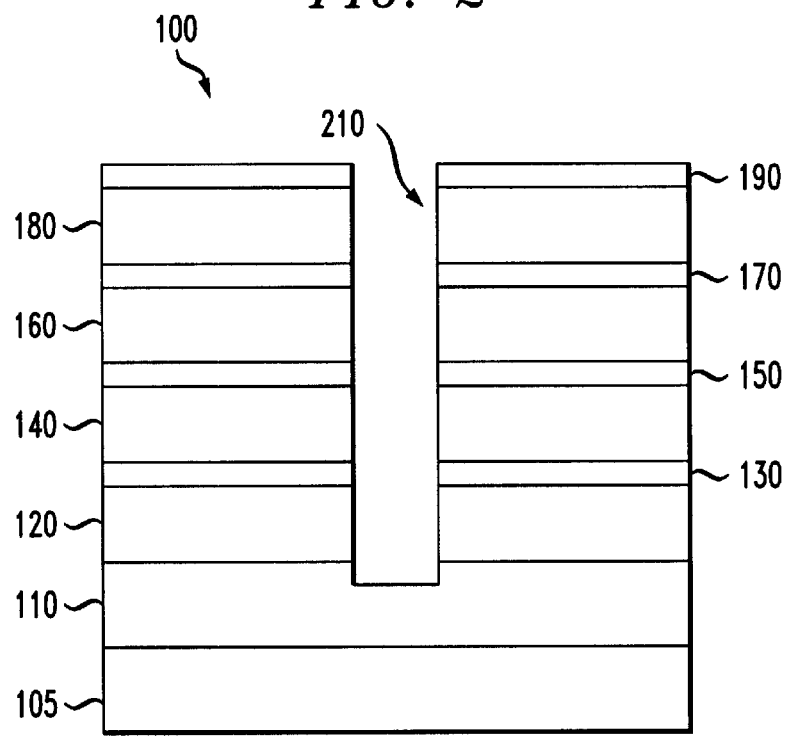
FIG. 2 illustrates a partial sectional view of the formation of a trench within the VRG structure of FIG. 1B.

FIG. 2 illustrates the formation of a trench 210 within the VRG structure 100 illustrated in FIG. 1B. To accomplish this, the VRG structure 100 is conventionally patterned with photoresist to expose a portion where the trench 210 is desired. The exposed portion of the VRG structure 100 is then subjected to a traditional trench etch which forms the illustrated trench 210. In the illustrated embodiment, the trench 210 is formed down to and partially within the first source/drain region 110. One having skill in the art is familiar with the above-described trenching process.

Figure 3:
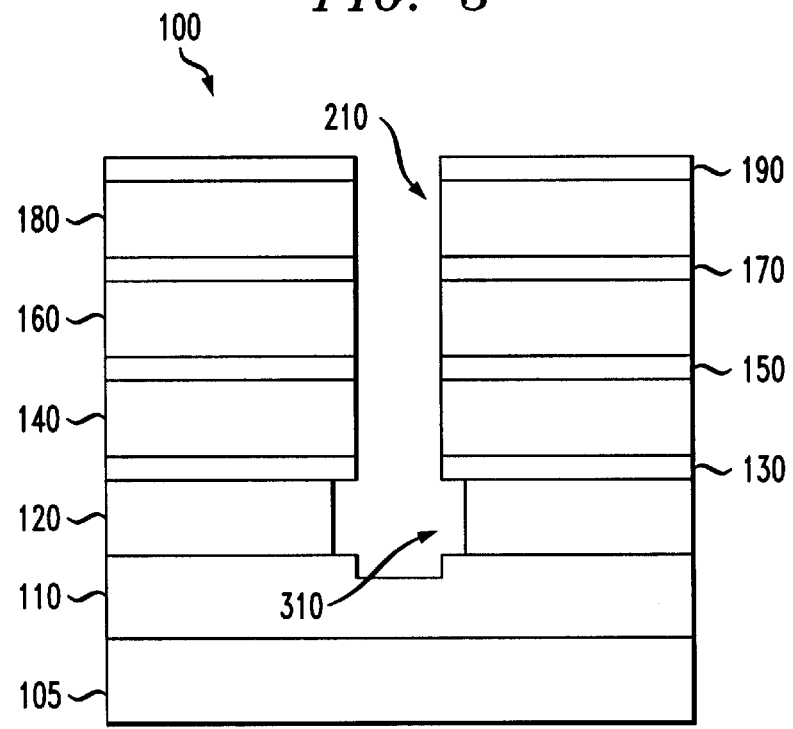
FIG. 3 illustrates a partial sectional view of the VRG structure undergoing an isotropic etch within a conductive layer.

Turning now to FIG. 3, once the trench 210 is formed, an isotropic etch is conducted within trench 210 to create recesses 310 within the conductive layer 120. As discussed earlier, the conductive layer 120 may comprise various conductive materials. In such cases, one who is skilled in the art knows how to select the appropriate etching chemistry for that material. For example, if the conductive layer 120 is WSi, a WSi etching chemistry would be selected.

Figure 4:
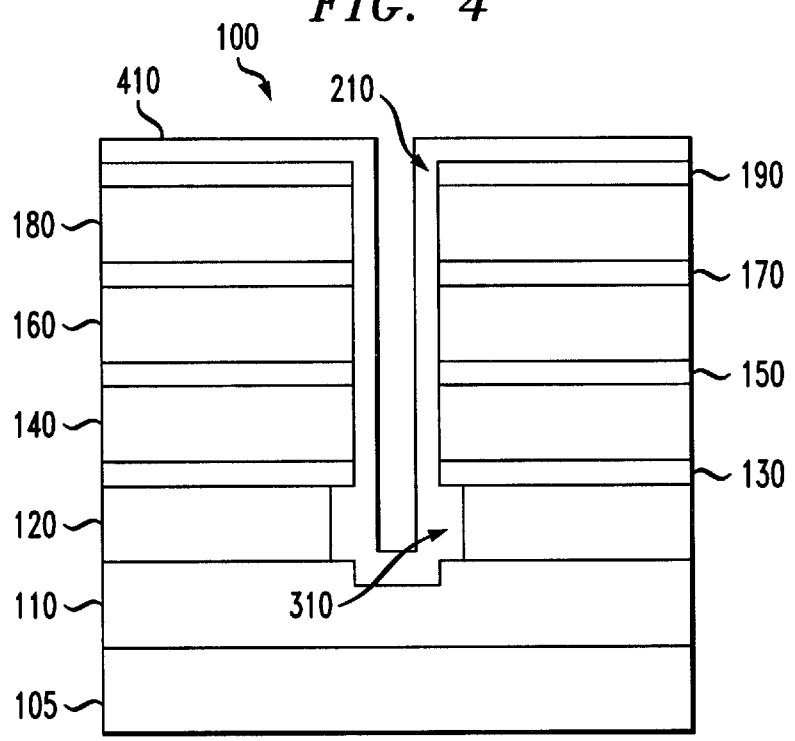
FIG. 4 illustrates a partial sectional view of a thin conformal oxide layer covering the fourth dielectric layer and filling the trench, including the recesses.

Following the creation of the recesses 310, the VRG structure 100 is subjected to the formation of a thin conformal oxide layer 410, as illustrated in FIG. 4. The thin conformal oxide layer 410 covers the fourth dielectric layer 190 and deposits on the side walls of the trench 210, including the recesses 310, as shown. One having skill in the art knows that the thin conformal oxide layer 410 may comprise any oxide material that provides desirable properties.

Figure 5:
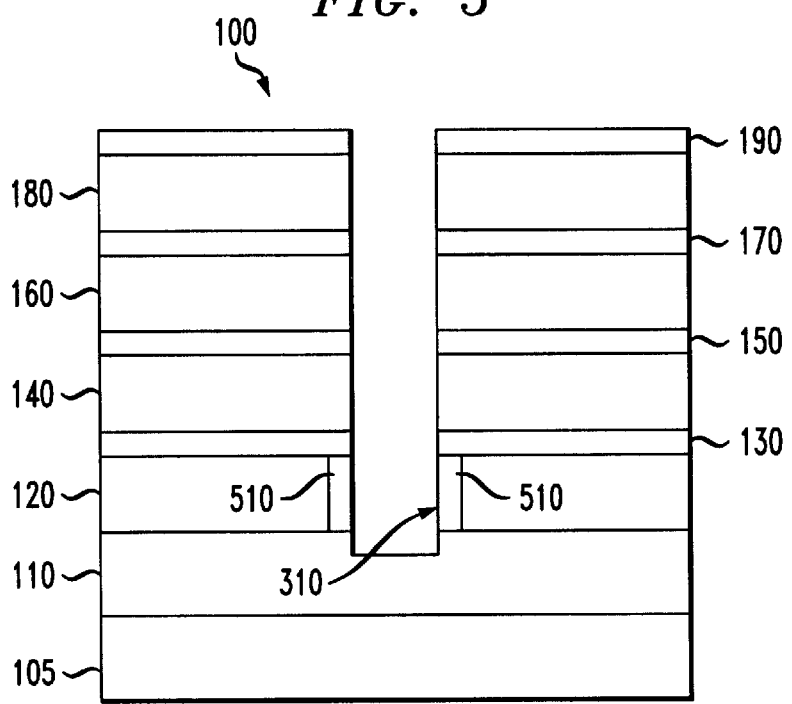
FIG. 5 illustrates a partial section view of the dielectric regions within the recesses, after removal of the oxide layer.

Turning now to FIG. 5, after the conformal deposition of the oxide layer 410, an anisotropic etch is conducted on the VRG structure 100, which leaves dielectric regions 510 within the recesses 310. In the illustrated embodiment, the dielectric regions 510 comprise silicon dioxide ($SiO_2$), but one having skill in the art knows other materials may be used. Furthermore, the dielectric regions 510 may be doped or undoped.

Figure 6:
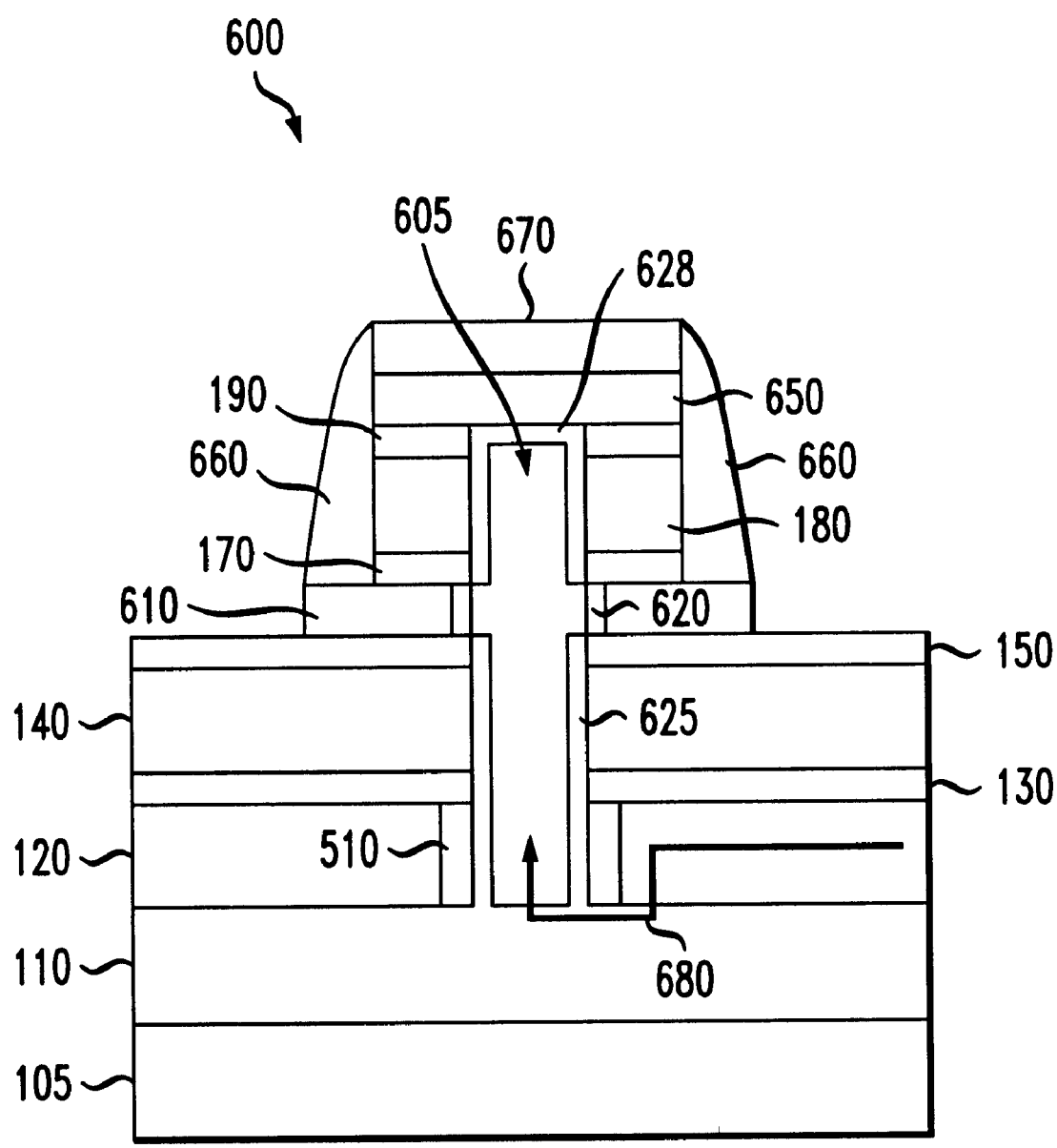
FIG. 6 illustrates a partial sectional view of a completed VRG structure in accordance with one embodiment of the present invention.

Turning now to FIG. 6, the VRG structure 100 illustrated in FIG. 5 undergoes a conventional selective epitaxial growth in the trench 210 (FIG. 2), which forms a conductive channel 605, which preferably comprises doped or undoped silicon. The conductive channel 605 connects the first source/drain region 110 with a second source/drain region 650. The exposed portion of the conductive channel 605 then undergoes a standard VRG-MOSFET process, leaving the completed VRG structure 600 of the present invention, illustrated in FIG. 6.

The completed VRG structure 600 includes a gate 610 located over, but separated from, the conductive layer 120, the gate 610 having the third dielectric layer 170 deposited thereon. The completed VRG structure 600 also includes a second insulating layer 180 that is deposited over the third dielectric layer 170, a fourth dielectric layer 190 deposited over the second insulating layer 180, the gate 610 and the conductive layer 120, and a second source/drain region 650 deposited over the channel 605, gate 610 and conductive layer 120. The completed VRG structure 600 also has gate dielectrics 620 located between the gate 610 and the conductive channel 605, and conventionally formed first source/drain region extension 625 and second source/drain region extension 628. One having skill in the art knows that the first source/drain region extension 625 and the second source/drain region extension 628 may be formed by solid source diffusion. Dielectric spacers 660 and capping dielectric layer 670, both of which are preferably nitrides, are also conventionally formed to complete the VRG structure 600. FIG. 6 does not show the gate 610 having a gate contact such that voltages may be applied to the gate 610; however, one having skill in the art knows how to apply voltages to the gate 610.

The arrow 680 illustrates the path the current travels between the contact portion of the first source/drain region and the contact portion of the second source/drain region, when a voltage is applied to the gate 610. As discussed earlier, the conductive layer 120 in the illustrated embodiment provides an electrical path having a low sheet resistance to the first source/drain region 110. In the embodiment employing WSi, the conductive layer 120 has a sheet resistance of about 20 Ω/square, which is about half an order of magnitude lower than the sheet resistance of the high dose n-type implanted drain (of about 50 Ω/square) of conventional VRG structures. As such, the current 680 takes the path of least resistance, by traveling through the conductive layer 120 until it reaches the dielectric region 510, dropping down into the first source/drain region 110, going around the dielectric region 510 and traveling up the conductive channel 605. The current 680 is unable to travel up when encountering the dielectric region 510 because of the first dielectric layer 130. The first dielectric layer 130 provides both isolation of the current from the above layers and stress relief between such layers. If the dielectric regions 510 were not present, the conductive layer 120 conductive channel 605 interface might have dislocations, resulting in a poor electrical interface between the conductive layer 120 and conductive channel 605. A poor electrical interface could in turn slow device speeds considerably.

As mentioned earlier, the conductive layer may also comprise $CoSi_2$ which has a sheet resistance of about 10 Ω/square, $TiSi_2$ and TiN. Thus, the low sheet resistance conductive layer 120, regardless of what low sheet resistance conductive metal is used, reduces the first source/drain sheet resistance, which in turn leads to a higher current drive ($I_{ON}$). This in turn, provides the semiconductor manufacturing industry with the benefit of increased performance without compromising device speed.

Figure 7:
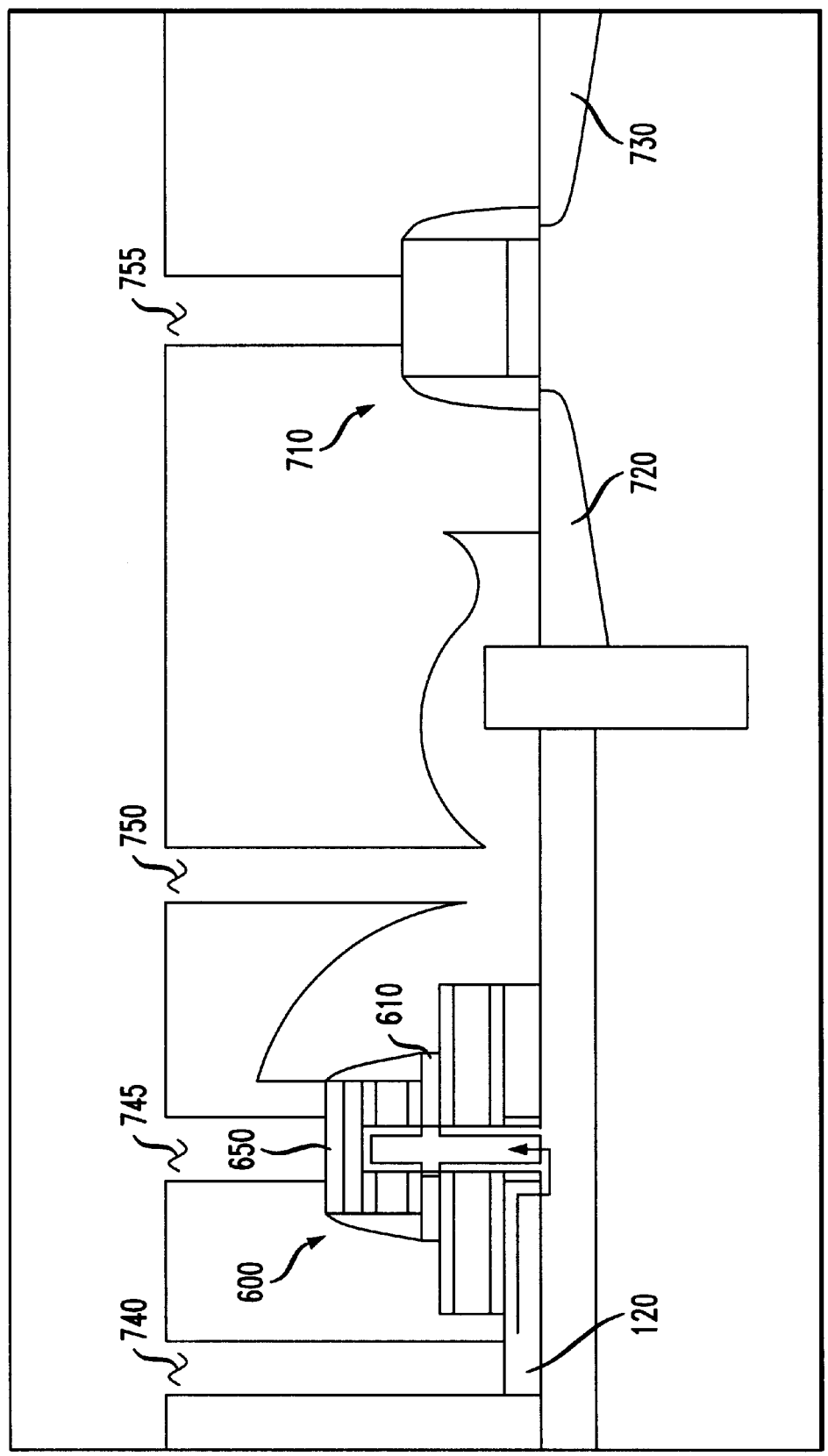
FIG. 7 illustrates a partial sectional view of an integrated circuit, including a conventional transistor and the completed VRG structure illustrated in FIG. 6.

Turning briefly to FIG. 7, with continued reference to FIG. 6, illustrated is the completed VRG structure 600 located within a conventional integrated circuit 700. The integrated circuit 700 may, in another embodiment, include a conventional lateral transistor 710, such as a complementary metal oxide semiconductor (CMOS) transistor, the transistor 710 having a source 720 and a drain 730. The integrated circuit 700 also includes conventionally formed interconnects 740, 745, 750, 755 formed in interlevel dielectric layers 760 and interconnecting the transistor 710 and VRG structure 600 to form the integrated circuit 700. One having skill in the art knows that multiple VRG structures 600 and transistors 710 could be located within the completed integrated circuit 700. Moreover, as with the conventional transistor 710, the VRG structure 600 is operated by supplying a bias voltage between a combination of the second source/drain region 650, the gate 610 and the conductive layer 120. The voltage may be applied to the conductive layer 120 through the interconnect 740, to the second source/drain region 650 through the interconnect 745 and to the gate through the interconnect 750. During operation, the current 680 is caused to flow through the conductive layer 120 and up to the dielectric regions 510. The dielectric region 510 acts as a barrier to the current flow, which causes at least a portion of the current 680 to be diverted into the first source/drain region 110. The current 680 then traverses the conductive channel 605 to the second source/drain region 650 and activates the VRG structure 600. Even though the interconnects 740, 745, 750, 755 have been illustrated in the sectional view shown in FIG. 7, one having skill in the art knows that the interconnects could also contact their respective devices in a dimension outside the one shown in FIG. 7.

Although the present invention has been described in detail, those skilled in the art should understand that they can make various changes, substitutions and alterations herein without departing from the spirit and scope of the invention in its broadest form.

What is claimed is:

1. A vertical gate transistor, comprising:
   a first source/drain region located in a semiconductor wafer substrate;
   a conductive layer having a thickness and extending over the first source/drain region, wherein the conductive layer provides electrical connection to the first source/drain region;
   a second source/drain region located over the first source/drain region;
   a conductive channel extending from the first source/drain region to the second source/drain region; and
   at least one dielectric region defined by a thickness that is coextensive with the thickness of the conductive layer and located between the conductive channel and the conductive layer.

2. The vertical gate transistor as recited in claim 1 further including a gate located over the conductive layer.

3. The vertical gate transistor as recited in claim 2 further comprising a first insulating region located between the conductive layer and the gate and a second insulating region located between the gate and the second source/drain region.

4. The vertical gate transistor as recited in claim 3 wherein the first insulating region includes a nitride layer and the second insulating region includes another nitride layer.

5. The vertical gate transistor as recited in claim 1 wherein the at least one dielectric region is a silicon dioxide region.

6. The vertical gate transistor as recited in claim 1 wherein the conductive layer is a metal silicide layer and is comprised of tungsten silicide.

7. The vertical gate transistor as recited in claim 1 wherein the conductive layer is a metal silicide layer and is comprised of cobalt silicide.

8. The vertical gate transistor as recited in claim 1 wherein the conductive layer is a metal silicide layer and is comprised of titanium silicide.

9. The vertical gate transistor as recited in claim 1 wherein the conductive layer is a metal layer.

10. The vertical gate transistor as recited in claim 9 wherein the metal layer is titanium nitride.

11. The vertical gate transistor as recited in claim 1 wherein a sheet resistance of the conductive layer is less than about 50 Ω/square.

12. The vertical gate transistor as recited in claim 11 wherein the sheet resistance is less than about 20 Ω/square.

13. The vertical gate transistor as recited in claim 1 further including first and second source/drain extensions located in the conductive channel.

14. An integrated circuit, comprising:
   lateral transistors;
   vertical gate transistors, wherein at least one of the vertical gate transistors includes:
      a first source/drain region located in a semiconductor wafer substrate;
      a conductive layer having a thickness and extending along the first source/drain region, wherein the conductive layer provides electrical connection to the first source/drain region;
      a second source/drain region located over the first source/drain region;
      a conductive channel extending from the first source/drain region to the second source/drain region; and
      at least one dielectric region defined by a thickness that is coextensive with the thickness of the conductive layer and located between the conductive channel and the conductive layer; and interconnect structures formed in interlevel dielectric layers that interconnect the lateral transistors and vertical gate transistors to form an integrated circuit.

15. The integrated circuit as recited in claim 14 wherein the vertical gate transistors each further include a gate located over the conductive layer.

16. The integrated circuit as recited in claim 15 further comprising a first insulating region located between the conductive layer and the gate and a second insulating region located between the gate and the second source/drain region.

17. The integrated circuit as recited in claim 16 wherein the first insulating region includes a nitride layer and the second insulating region includes another nitride layer.

18. The integrated circuit as recited in claim 14 wherein the at least one dielectric region is a silicon dioxide region.

19. The integrated circuit as recited in claim 14 wherein the conductive layer is a metal silicide layer and is comprised of tungsten silicide.

20. The integrated circuit as recited in claim 14 wherein the conductive layer is a metal silicide layer and is comprised of cobalt silicide.

21. The integrated circuit as recited in claim 14 wherein the conductive layer is a metal silicide layer and is comprised of titanium silicide.

22. The integrated circuit as recited in claim 14 wherein the conductive layer is a metal layer.

23. The integrated circuit as recited in claim 22 wherein the metal layer comprises titanium nitride.

24. The integrated circuit as recited in claim 14 wherein at each of the vertical gate transistors further include first and second source/drain extensions located in the conductive channel.

* * * * *